(12) United States Patent
Gardner et al.

(10) Patent No.: US 6,767,794 B2
(45) Date of Patent: *Jul. 27, 2004

(54) METHOD OF MAKING ULTRA THIN OXIDE FORMATION USING SELECTIVE ETCHBACK TECHNIQUE INTEGRATED WITH THIN NITRIDE LAYER FOR HIGH PERFORMANCE MOSFET

(75) Inventors: Mark I. Gardner, Cedar Creek, TX (US); Michael Allen, Austin, TX (US); H. James Fulford, Austin, TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/002,724
(22) Filed: Jan. 5, 1998

(65) Prior Publication Data

US 2002/0022325 A1 Feb. 21, 2002

(51) Int. Cl.⁷ .......................................... H01L 21/336
(52) U.S. Cl. ...................... 438/287; 438/591; 438/743; 438/744; 438/756; 438/757
(58) Field of Search ................................ 438/287, 591, 438/756, 757, 743, 744

(56) References Cited

U.S. PATENT DOCUMENTS

| | | | | |
|---|---|---|---|---|
| 4,414,058 A | * | 11/1983 | Mueller | ...................... 156/643 |
| 4,543,707 A | * | 10/1985 | Ito et al. | ...................... 438/701 |
| 5,294,563 A | * | 3/1994 | Rao | |
| 5,296,411 A | * | 3/1994 | Gardner et al. | |
| 5,316,981 A | * | 5/1994 | Gardner et al. | |
| 5,397,720 A | * | 3/1995 | Kwong et al. | |
| 5,538,923 A | * | 7/1996 | Gardner et al. | |
| 5,674,788 A | * | 10/1997 | Wristers et al. | |
| 5,851,888 A | * | 12/1998 | Gardner et al. | |
| 5,856,226 A | * | 1/1999 | Wu | ........................... 438/291 |
| 5,877,057 A | * | 3/1999 | Gardner et al. | |
| 5,998,253 A | * | 12/1999 | Loh et al. | ..................... 438/243 |
| 6,087,241 A | * | 7/2000 | St. Amand et al. | ......... 438/400 |

FOREIGN PATENT DOCUMENTS

JP 62181474 A * 8/1987

OTHER PUBLICATIONS

Sorab K. Ghandi, VLSI Fabrication Principles, Silicon and Gallium Arsenide, 2nd Edition, pp. 639–642, 1994.*

(List continued on next page.)

*Primary Examiner*—W. David Coleman
*Assistant Examiner*—Khiem D Nguyen

(57) ABSTRACT

A semiconductor device having gate oxide with a first thickness and a second thickness is formed by initially implanting a portion of the gate area of the semiconductor substrate with nitrogen ions and then forming a gate oxide on the gate area. Preferably the gate oxide is grown by exposing the gate area to an environment of oxygen. A nitrogen implant inhibits the rate of $SiO_2$ growth in an oxygen environment. Therefore, the portion of the gate area with implanted nitrogen atoms will grow or form a layer of gate oxide, such as $SiO_2$, which is thinner than the portion of the gate area less heavily implanted or not implanted with nitrogen atoms. The gate oxide layer could be deposited rather than growing the gate oxide layer. After forming the gate oxide layer, polysilicon is deposited onto the gate oxide. The semiconductor substrate can then be implanted to form doped drain and source regions. Spacers can then be placed over the drain and source regions and adjacent the ends of the sidewalls of the gate.

7 Claims, 6 Drawing Sheets

OTHER PUBLICATIONS

A.C. Adams, Dielectric and Polysilicon film deposition, VLSI Technology, 2nd Edition, pp. 233–235, 1988.*

Abdul–Rahim et al, Improved control of polysilicon emitter interfacial oxide using a UHV–compatible LPCVD cluster tool, pp. IEEE, 232–236, Nov. 1997.*

Sodini et al., Silicon Oxynitride Gate Dielectrics for Scaled CMOS, IEEE, pp. 617–620, 1992.*

* cited by examiner

METHOD OF MAKING ULTRA THIN OXIDE FORMATION USING SELECTIVE ETCHBACK TECHNIQUE INTEGRATED WITH THIN NITRIDE LAYER FOR HIGH PERFORMANCE MOSFET

FIELD OF THE INVENTION

The present invention relates generally to integrated circuit manufacturing and more particularly to forming insulated gate field effect transistors.

BACKGROUND OF THE INVENTION

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. Currently, the gate oxide is formed having a substantially uniform thickness. The operation of the IGFET involves application of an input voltage to the gate, which sets up a transverse electric field in the channel in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate which provides a mask during formation of the source and drain by ion implantation. Thereafter, a drive-in step is applied to repair crystalline damage and to drive-in and activate the implanted dopant.

There is a desire to reduce the dimensions of the IGFET. The impetus for device dimension reduction comes from several interests. One is the desire to increase the number of individual IGFETs that can be placed onto a single silicon chip or die. More IGFETs on a single chip leads to increased functionality. A second desire is to improve performance, and particularly the speed, of the IGFET transistors. Increased speed allows for a greater number of operations to be performed in less time. IGFETs are used in great quantity in computers where the push to obtain higher operation cycle speeds demands faster IGFET performance.

One method to increase the speed of an IGFET is to reduce the length of the conduction channel underneath the gate and dielectric layer regions. However, as IGFET dimensions are reduced and the supply voltage remains constant (e.g., 3 V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

As IGFET dimensions are reduced and the supply voltage remains constant (e.g., 3 V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

Another method to increase the speed of an IGFET is to reduce the thickness of the gate oxide or the dielectric layer at the gate and adjacent the channel. The thinner the gate oxide, the faster the device and the lower the threshold voltage. Current gate oxide thicknesses for production devices are in the 50 angstrom to 100 angstrom range. The technology roadmap projects that as the industry enters the 0.35 micron and 0.18 micron design rule era, gate thicknesses will fall into the 40 angstrom to 20 angstrom range. In this range, maintaining thickness control, pinhole-free small area gates is making the manufacture of these gates difficult. When such gates are made, they are not necessarily reliable and do not last for the normal service life of a device.

There is always a need to increase the performance of devices since there is always a demand for faster and faster computers. Therefore, there is a need for an oxide layer which is much thinner than available today. There is also a need for an oxide layer that is not only thin, but which will also perform reliably over the normal service life of a component incorporating the device. Furthermore, there is need for a device which is manufacturable and which can be made using as few steps as possible. Further there is a need for steps which can be readily controlled during manufacture.

SUMMARY OF THE INVENTION

A semiconductor device having gate oxide with a first thickness and a second thickness is formed by initially implanting a portion of the gate area of the semiconductor substrate with nitrogen ions and then forming a gate oxide on the gate area. Preferably the gate oxide is grown by exposing the gate area to an environment of oxygen. A nitrogen implant inhibits the rate of $SiO_2$ growth in an oxygen environment. Therefore, the portion of the gate area with implanted nitrogen atoms will grow or form a layer of gate oxide, such as $SiO_2$, which is thinner than the portion of the gate area less heavily implanted or not implanted with nitrogen atoms. The gate oxide layer could be deposited rather than growing the gate oxide layer. After forming the gate oxide layer, polysilicon is deposited onto the gate oxide. The semiconductor substrate can then be implanted to form doped drain and source regions. Spacers can then be placed over the drain and source regions and adjacent the ends of the sidewalls of the gate.

A method for forming a semiconductor device to produce graded doping in the source region and the drain region includes the steps of implanting the gate material, usually a polysilicon, with a dopant ion that varies the level of oxide formation on the gate. The dopant ion is driven into undoped polysilicon. Nitrogen ions, may also be implanted in the polysilicon to contain the previously implanted ions. For N-type transistors, typically arsenic is implanted. For P-type transistors, typically boron is implanted. Gates are formed. The gate structure is then oxidized. The oxidation process is controlled to grow a desired thickness of silicon dioxide on the gate. The portion of the gate carrying the dopant grows silicon dioxide either more quickly or more slowly. An isotropic etch can then used to remove a portion of the silicon oxide and form a knob on each sidewall of the gate. A heavy ion implant is then done to convert a portion of the lightly doped source region into a heavily doped region within the source region, and to convert a portion of the lightly doped drain region into a heavily doped region within the drain region. Some of the implanted ions are stopped by the knobs on the gate sidewalls. The regions under the knobs do not have as deep an ion implantation resulting in a shallow region beneath the knob. This forms a graded junction having a specific geometry. The geometry of the interface between the lightly doped region and the heavily doped region in the source region and the drain region depends on the geometry (thickness) of silicon dioxide knobs formed on the sidewall of the gate and on the length of the knob.

Advantageously, the dimensions of the silicon dioxide knob can be varied to form a graded channel having a different geometry. The steps are easily performed and one implantation for heavy doping is all that is needed to form the graded junction or doping pattern. The resulting device has a longer life, is more reliable and less likely to fail than devices without graded doped drains and sources. In addition, the geometry of the doping profile can be controlled more precisely using this invention. Information handling systems including such a device are also more reliable and long lived.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENT

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1A:
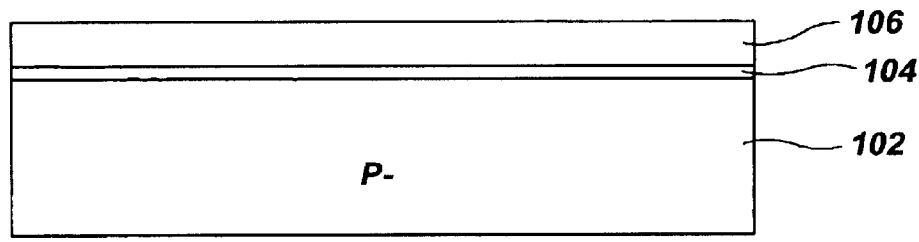
FIGS. 1A–1F show cross-sectional views of successive process steps for making an IGFET having a uniform gate oxide layer and graded doping in the drain region and source region.

An NMOSFET is described to show the most common method for forming a transistor device with a graded source and drain. The NMOSFET has a silicon dioxide gate oxide with a graded doped drain and source. In FIG. 1A, silicon substrate 102 suitable for integrated circuit manufacture includes P-type epitaxial layer with a boron background concentration on the order of $1 \times 10^{16}$ atoms/cm$^3$, a <100>orientation and a resistivity of 12 ohm-cm. Preferably, the epitaxial surface layer is disposed on a P+ base layer (not shown) and includes a planar top surface. Gate oxide 104, composed of silicon dioxide (SiO$_2$), is formed on the top surface of substrate 102 using oxide tube growth at a temperature of 700° to 1000° C. in an O$_2$ containing ambient. A typical oxidation tube contains several sets of electronically powered heating coils surrounding the tube, which is either quartz, silicon carbide, or silicon. In O$_2$ gas oxidation, the wafers are placed in the tube in a quartz "boat" or "elephant" and the gas flow is directed across the wafer surfaces to the opposite or exhaust end of the tube. A gate oxide 104 having a uniform thickness is formed.

Thereafter, a blanket layer of undoped polysilicon 106 is deposited by low pressure chemical vapor deposition (LPCVD) on the top surface of gate oxide 104. Polysilicon 106 has a thickness of 2000 angstroms. If desired, polysilicon 106 can be doped in situ as deposition occurs, or doped before a subsequent etch step by implanting arsenic with a dosage in the range of $1 \times 10^{15}$ to $5 \times 10^{15}$ atoms/cm$^2$ and an energy in the range of 2 to 80 kiloelectron-volts. However, it is generally preferred that polysilicon 106 be doped during an implantation step following a subsequent etch step.

Figure 1B:
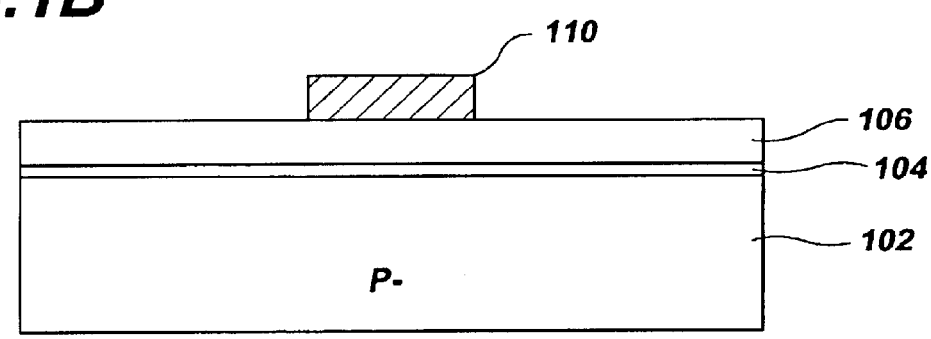

In FIG. 1B, photoresist 110 is deposited as a continuous layer on polysilicon 106 and selectively irradiated using a photolithographic system, such as a step and repeat optical projection system, in which I-line ultraviolet light from a mercury-vapor lamp is projected through a first reticle and a focusing lens to obtain a first image pattern. Thereafter, the photoresist 110 is developed and the irradiated portions of the photoresist are removed to provide openings in photoresist 110. The openings expose portions of polysilicon 106, thereby defining a gate.

Figure 1C:
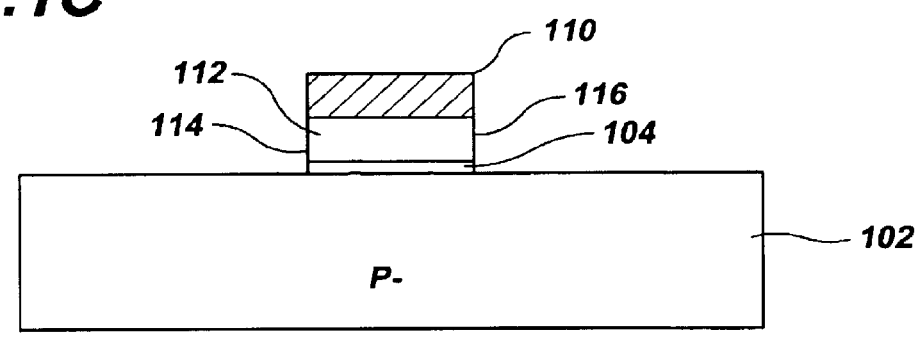

In FIG. 1C, an anisotropic etch is applied that removes the exposed portions of polysilicon 106. Various etchants can be used to anisotropically etch or to selectively remove the polysilicon and oxide layers. Preferably, a first dry or plasma etch is applied that is highly selective of polysilicon. Most of the polysilicon layer 106 is removed, except for the portion beneath the remaining photoresist 110. The gate oxide 104 is left on the surface of the silicon substrate 102 and has a thickness in the range of 60–300 angstroms. Typically, the gate oxide 104 is placed on the surface of the silicon substrate 102 at the selected thickness in the range of 60–300 angstroms. A second dry or plasma etch is applied that is highly selective of silicon dioxide (the typical gate material). After the etching step or steps, a gate oxide layer of 60–300 angstroms remains atop the surface of the silicon substrate, and the remaining portion of the polysilicon 106 provides polysilicon gate 112 with opposing vertical sidewalls 114 and 116.

Figure 1D:
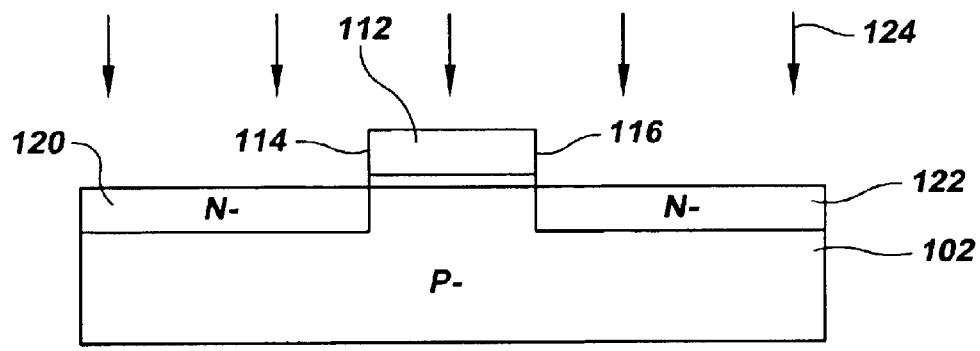

In FIG. 1D, photoresist 110 is stripped, and lightly doped source and drain regions 120 and 122 are implanted into substrate 102 by subjecting the structure to ion implantation of phosphorus, indicated by arrows 124, at a dose in the range of $1 \times 10^{13}$ to $5 \times 10^{14}$ atoms/cm$^2$ and an energy in the range of 2 to 35 kiloelectron-volts. The ion implantation of phosphorus is done through the layer of gate oxide 104. Polysilicon gate 112 provides an implant mask for the underlying portion of substrate 102. As a result, lightly doped source and drain regions 120 and 122 are substantially aligned with sidewalls 114 and 116, respectively. Lightly doped source and drain regions 120 and 122 are doped N—with a phosphorus concentration in the range of about $1 \times 10^{17}$ to $5 \times 10^{18}$ atoms/cm$^3$.

Figure 1E:
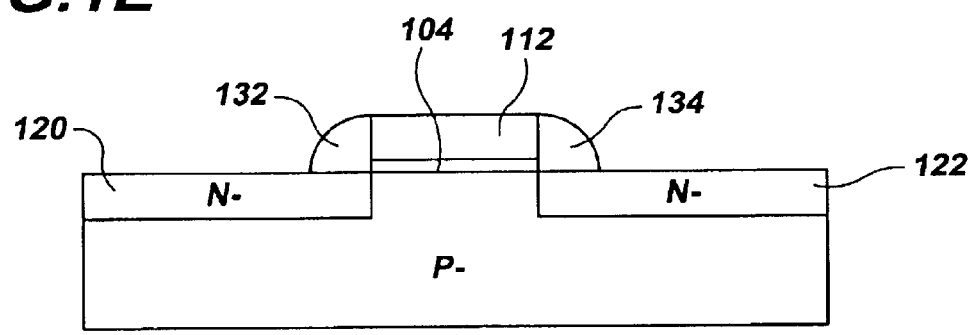

As shown in FIG. 1E, spacers 132 and 134 are formed. A blanket layer of silicon dioxide with a thickness of approximately 2500 angstroms is conformably deposited over the exposed surfaces by CVD at a temperature in the range of 300° to 400° C. Thereafter, the structure is subjected to an anisotropic etch, such as a reactive ion etch, that is highly selective of silicon dioxide to form oxide spacers 132 and 134 adjacent to sidewalls 114 and 116, respectively. Oxide spacers 132 and 134 each extend approximately 1200 angstroms across substrate 102.

Figure 1F:
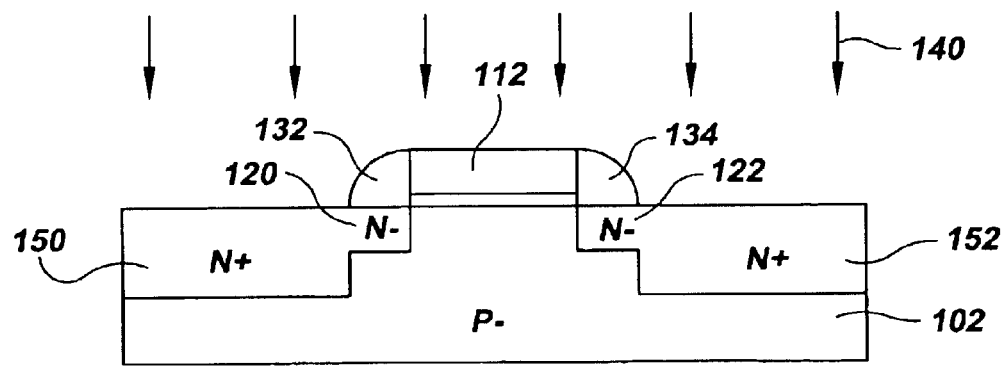

In FIG. 1F, the portions of the lightly doped source region 120 and the lightly doped drain region 122 outside oxide spacers 132 and 134 are converted into heavily doped source region 150 and heavily doped drain region 152 by subjecting the structure to ion implantation of arsenic, indicated by arrows 140, at a dose in the range of $2\times10^{15}$ to $6\times10^{15}$ atoms/cm$^2$ and an energy in the range of 20 to 80 kiloelectron-volts. Polysilicon gate 112 and oxide spacers 132 and 134 provide an implant mask for the underlying portion of substrate 102. As a result, the heavily doped source region 150 and heavily doped drain region 152 are substantially aligned with the oxide spacer 132 on the side opposite sidewall 114, and the oxide spacer 134 on the side opposite sidewall 116. A rapid thermal anneal on the order of 900° to 1050° C. for 10 to 30 seconds is applied to remove crystalline damage and to drive-in and activate the implanted dopants. As a result, heavily doped source region 150 and the lightly doped source region 120 merge to form a source with graded doping. Similarly, heavily doped source region 152 and the lightly doped source region 122 merge to form a drain with graded doping.

Among the problems with the above technique for forming a transistor type semiconductor device is that it is difficult to make a reliable gate having an oxide thickness much less than 30 angstroms. At thicknesses below 30 angstroms, pin holes develop in the silicon oxide layer which allow electrons through the gate oxide. A short develops and the transistor is ruined. It is also difficult to form a silicon oxide gate having a layer much thinner since the processing steps used are not controllable.

Figure 2A:
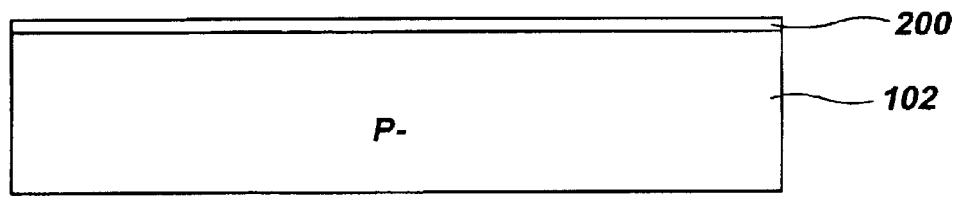
FIGS. 2A–2H show cross-sectional views of successive process steps for making an IGFET with a gate oxide having several thicknesses in accordance with an embodiment of the invention.

As shown in FIG. 2A, a substrate 102 has a layer of nitrous oxide bearing film ("NO") 200 grown upon the substrate. The film 200 is also known as a NO variant film. The NO film has a thickness of 20–40 angstroms after it is grown on the surface of the substrate 102. It should be noted that the NO film may be grown or it can also be deposited on the surface of the substrate using any technique, including low pressure chemical vapor deposition (LPCVD) or sputtering. It should also be noted that any nitrogen bearing substance can be used to form the 20–40 angstrom thick film on the surface of the substrate 102.

Figure 2B:
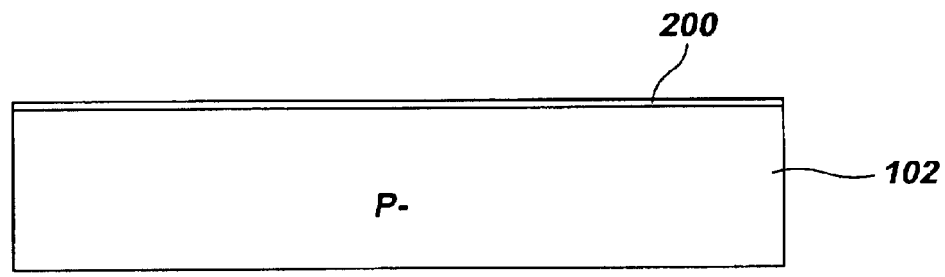

As shown in FIG. 2B, after the NO variant film 200 is grown or deposited on the substrate 102, the 20–40 angstrom thick film is thinned to 5–10 angstroms using a wet or dry etching technique. In the preferred method, a dilute wet etch of Hf (hydrofloric acid) is used as a dip etch. The ratio of water to Hf is in the range of 100:1 to 200:1. The resulting etch is very predictable and removes about an angstrom of NO variant film per second.

Figure 2C:
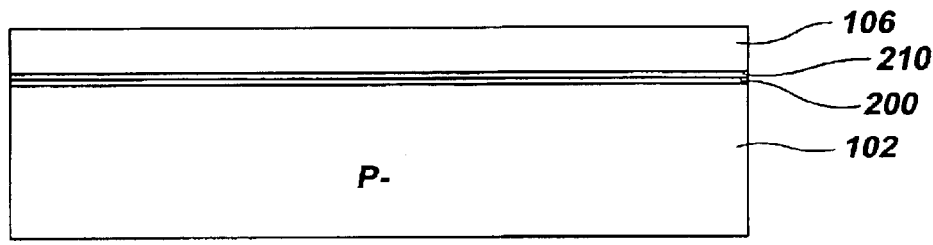

The next step, shown by FIG. 2C, is to deposit a layer of nitride 210 onto the thinned NO variant film 200. In the preferred method, a nitride layer of 5–10 angstroms is deposited using an LPCVD technique or by sputtering. The structure formed is then annealed using a rapid thermal anneal (RTA) for a time of 10–30 seconds at a temperature of 800–1100 degrees Celsius.

The combined thickness of the layer 200 of NO and the layer 210 of nitride is less than 20 angstroms. The combined thickness of the layer 200 of NO and the layer 210 of nitride will be in the range of 6 angstroms to 14 angstroms. Preferably, the combined thickness of the layer 200 of NO and the layer 210 of nitride will be in the range of 7.5 angstroms to 10 angstroms.

It should be noted that the thinned layer of NO film 200 would form a reliable gate oxide for an NMOSFET. The layer of nitride is added to the NO film 200 so that this combination could be used for a PMOSFET. PMOSFETs have boron in the gate electrode. Boron has the property that it diffuses very rapidly when it gets to the oxide layer. Nitrogen inhibits the diffusion of boron. Although the NO film has nitrogen atoms therein, the concentration is approximately three percent and this low concentration does not completely inhibit the diffusion of boron atoms. The nitride layer 210 is added so that the gate oxide material will stop the diffusion of boron atoms. Thus, the combined layer 200 of NO and layer 210 of nitride can be used as a gate oxide or dielectric for both NMOSFETs and PMOSFETs.

Thereafter, a blanket layer of undoped polysilicon 106 is deposited by low pressure chemical vapor deposition (LPCVD) on the top surface of gate oxide 104. Polysilicon 106 has a thickness of 2000 angstroms. If desired, polysilicon 106 can be doped in situ as deposition occurs, or doped before a subsequent etch step by implanting arsenic with a dosage in the range of $1\times10^{15}$ to $5\times10^{15}$ atoms/cm$^2$ and an energy in the range of 2 to 80 kiloelectron-volts. However, it is generally preferred that polysilicon 106 be doped during an implantation step following a subsequent etch step.

The remaining steps, described in FIGS. 2D to 2H, required to form an IGFET from the structure shown in FIG. 2C, correspond to the processing steps shown and described above using FIGS. 1B to 1F above. The difference is that the oxide layer 104 of FIGS. 1B to 1F above has been substituted with the combined NO film layer 200 and the nitride layer 210. The common reference numbers for common structural parts have been kept the same.

Figure 2D:
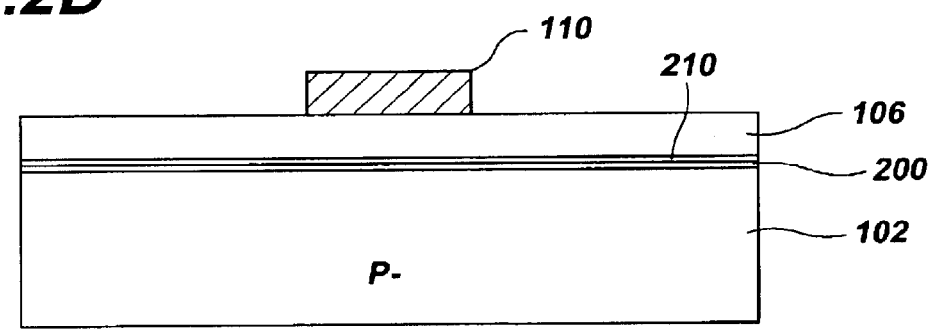

In FIG. 2D, photoresist 110 is deposited as a continuous layer on polysilicon 106 and selectively irradiated using a photolithographic system, such as a step and repeat optical projection system, in which I-line ultraviolet light from a mercury-vapor lamp is projected through a first reticle and a focusing lens to obtain a first image pattern. Thereafter, the photoresist 110 is developed and the irradiated portions of the photoresist are removed to provide openings in photoresist 110. The openings expose portions of polysilicon 106, thereby defining a gate.

Figure 2E:
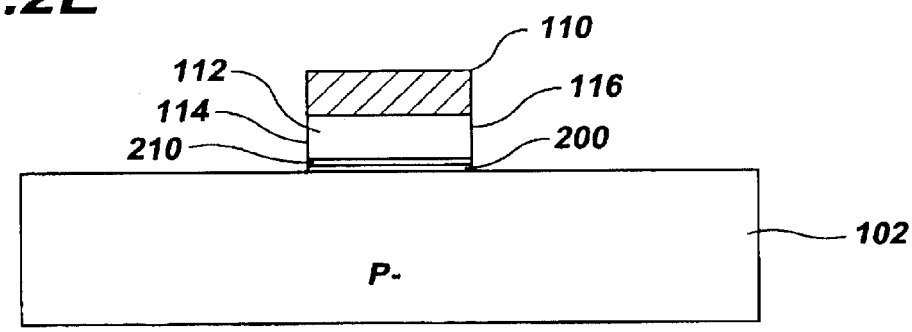

In FIG. 2E, an anisotropic etch is applied that removes the exposed portions of polysilicon 106. Various etchants can be used to anisotropically etch or to selectively remove the polysilicon 106, the nitride layer 210, and nitrous oxide layer 200. Preferably, a first dry or plasma etch is applied that is highly selective of polysilicon. Most of the polysilicon layer 106 is removed, except for the portion beneath the remaining photoresist 110. The nitrous oxide film 200 and the nitride film 210 are left on the surface of the silicon substrate 102 beneath the remaining polysilicon 106. The remaining portion of the polysilicon 106 provides polysilicon gate 112 with opposing vertical sidewalls 114 and 116.

Figure 2F:
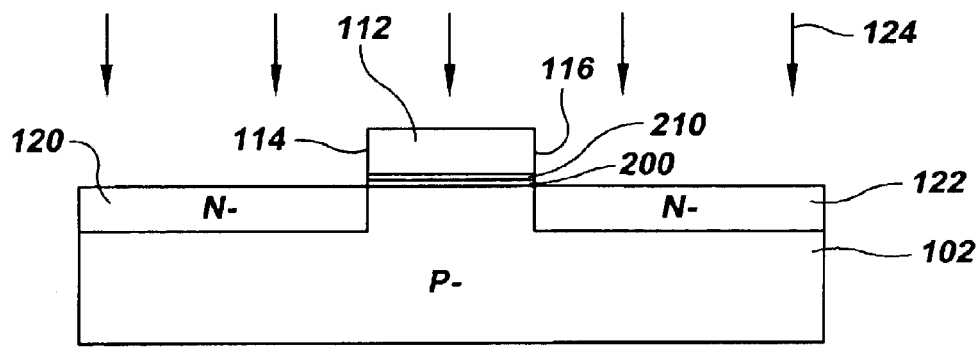

In FIG. 2F, photoresist 110 is stripped, and lightly doped source and drain regions 120 and 122 are implanted into substrate 102 by subjecting the structure to ion implantation of phosphorus, indicated by arrows 124, at a dose in the range of $1\times10^{13}$ to $5\times10^{14}$ atoms/cm$^2$ and an energy in the range of 2 to 35 kiloelectron-volts. The ion implantation of phosphorus is done through the layer of gate oxide 104.

Polysilicon gate 112 provides an implant mask for the underlying portion of substrate 102. As a result, lightly doped source and drain regions 120 and 122 are substantially aligned with sidewalls 114 and 116, respectively. Lightly doped source and drain regions 120 and 122 are doped N− with a phosphorus concentration in the range of about $1 \times 10^{17}$ to $5 \times 10^{18}$ atoms/cm$^3$.

Figure 2G:
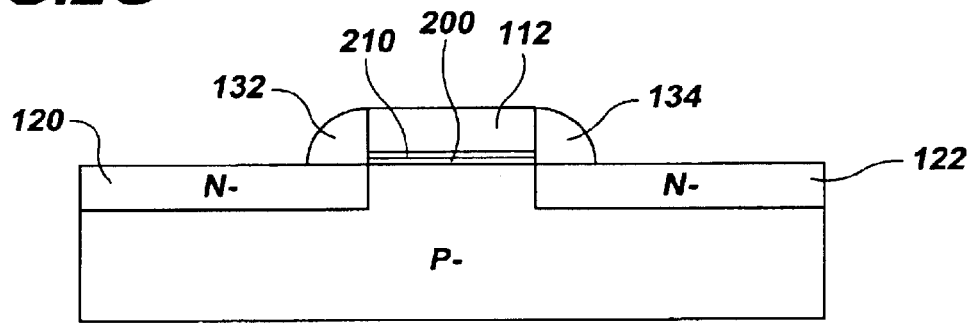

As shown in FIG. 2G, spacers 132 and 134 are formed. A blanket layer of silicon dioxide with a thickness of approximately 2500 angstroms is conformably deposited over the exposed surfaces by CVD at a temperature in the range of 300° to 400° C. Thereafter, the structure is subjected to an anisotropic etch, such as a reactive ion etch, that is highly selective of silicon dioxide to form oxide spacers 132 and 134 adjacent to sidewalls 114 and 116, respectively. Oxide spacers 132 and 134 each extend approximately 1200 angstroms across substrate 102.

Figure 2H:
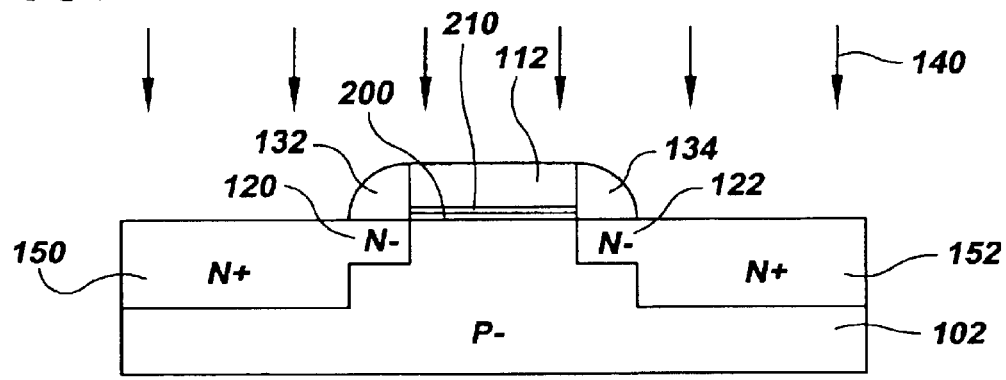

In FIG. 2H, the portions of the lightly doped source region 120 and the lightly doped drain region 122 outside oxide spacers 132 and 134 are converted into heavily doped source region 150 and heavily doped drain region 152 by subjecting the structure to ion implantation of arsenic, indicated by arrows 140, at a dose in the range of $2 \times 10^{15}$ to $3 \times 10^{15}$ atoms/cm$^2$ and an energy in the range of 20 to 80 kiloelectron-volts. Polysilicon gate 112 and oxide spacers 132 and 134 provide an implant mask for the underlying portion of substrate 102. As a result, the heavily doped source region 150 and heavily doped drain region 152 are substantially aligned with the oxide spacer 132 on the side opposite sidewall 114, and the oxide spacer 134 on the side opposite sidewall 116. A rapid thermal anneal on the order of 900° to 1050° C. for 10 to 30 seconds is applied to remove crystalline damage and to drive-in and activate the implanted dopants. As a result, heavily doped source region 150 and the lightly doped source region 120 merge to form a source with graded doping. Similarly, heavily doped source region 152 and the lightly doped source region 122 merge to form a drain with graded doping. Although an NMOSFET has been described above, a similar technique could be used to form a PMOSFET. As mentioned previously, the nitride layer 210 and NO film layer 200 would prevent migration of boron atoms through these layers.

Further processing steps in the fabrication of IGFETs typically include forming salicide contacts on the gate, source and drain, forming a thick oxide layer over the active region, forming contact windows in the oxide layer to expose the salicide conforming interconnect metallization in the contact windows, and forming a passivation layer over the interconnect metallization. Salicidation includes the formation of spacers on the gate, depositing a metal layer over the entire resulting surface and reacting the metal to form a salicide on top of the gate 112, on the top of the source 120 and on the top of the drain 122. Unreacted metal is then removed, glass is placed over the surface and a contact opening is formed for connectors. A passivation layer may also then deposited as a top surface. In addition, earlier or subsequent high-temperature process steps can be used to supplement or replace the desired anneal, activation, and drive-in functions. These further processing steps are conventional and need not be repeated herein. Likewise the principal processing steps disclosed herein may be combined with other steps apparent to those skilled in the art.

The present invention includes numerous variations to the embodiment described above. For instance, the gate insulator and spacers and can be various dielectrics including silicon dioxide, silicon nitride and silicon oxynitride. Suitable N-type dopants include arsenic, phosphorus and combinations thereof. Alternatively, if a P-channel device is desired, suitable P-type dopants include boron, boron species (such as boron difluoride) and combinations thereof.

Figure 3:
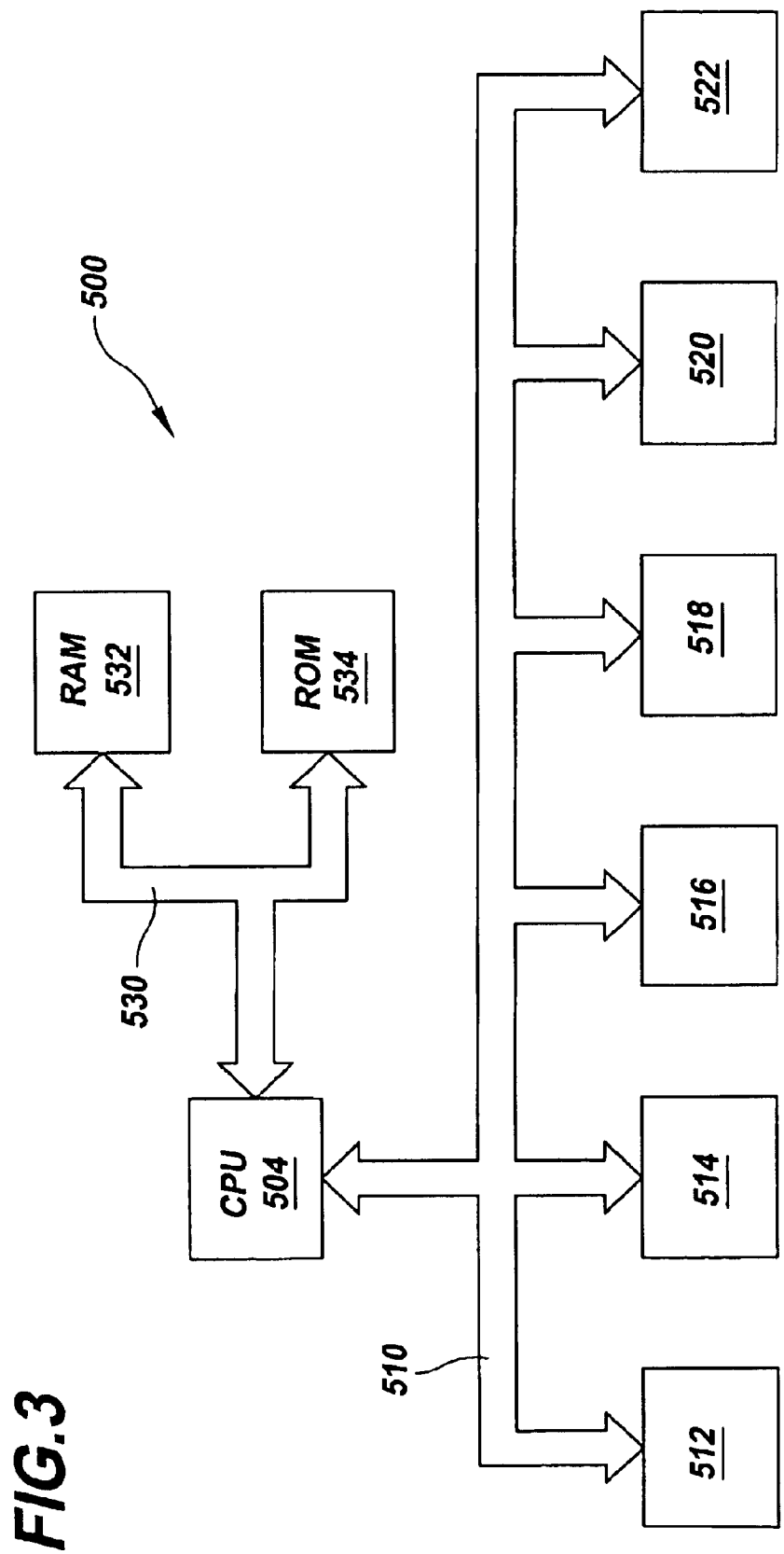
FIG. 3 is a schematic of an information handling system.

Advantageously, the invention is well-suited for use in a device such as an integrated circuit chip, as well as an electronic system including a microprocessor, a memory and a system bus. The electronic system may also be an information handling system 500 as shown in FIG. 3. The information handling system 500 includes a central processing unit 504, a random access memory 532, and a system bus 530 for communicatively coupling the central processing unit 504 and the random access memory 532. The information handling system 500 includes a device formed by the steps shown in FIGS. 2A–2I, as described above. The system 500 may also include an input/output bus 510 and several devices peripheral devices, such as 512, 514, 516, 518, 520, and 522 may be attached to the input output bus 510. Peripheral devices may include hard disk drives, floppy disk drives, monitors, keyboards and other such peripherals. The information handling system 500 includes a device such as is shown in FIG. 2H. The channel formed as in the steps shown in FIGS. 2A–2H and the resulting device provides for a fast and reliable channel having a long life. Faster channels are needed as clocking speeds for microprocessors climb and the channel must also be reliable and long-lived. The drain regions can be formed in one ion implant step rather than several. The length of the channel is also controllable since the spacers can also be controlled.

Although specific embodiments have been illustrated and described herein, it is appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the claims and the equivalents thereof.

What is claimed is:

1. A method for forming a semiconductor device comprising in sequence the steps of:
   providing a silicon substrate;
   forming an oxynitride layer on the substrate;
   thinning the oxynitride layer by etching and using the thinned oxynitride layer as an insulative layer in the semiconductor device; and
   depositing nitride onto the layer of thinned oxynitride and forming a nitride layer.

2. The method of claim 1 further comprising the step of depositing polysilicon on the nitride layer after forming a nitride layer.

3. The method of claim 2 further comprising the step of forming a gate by removing a first portion of the polysilicon, nitride and oxynitride on one side of the gate and a second portion of the polysilicon, nitride and oxynitride on the other side of the gate.

4. The method of claim 1, wherein the nitride layer is deposited by low pressure chemical vapor deposition.

5. The method of claim 1, wherein the nitride layer is deposited by sputtering.

6. The method of claim 1, further comprising the step of cleaning the nitride layer.

7. The method of claim 2, further comprising the step of annealing the semiconductor device immediately after depositing the nitride layer.

* * * * *